United States Patent [19]

Bauman et al.

[11] Patent Number: 4,596,977

[45] Date of Patent: Jun. 24, 1986

[54] DUAL SLOPE ANALOG TO DIGITAL CONVERTER WITH OUT-OF-RANGE RESET

[75] Inventors: Mitchell A. Bauman, Moundsview; David C. Ullestad, Brooklyn Park, both of Minn.

[73] Assignee: Honeywell Inc., Minneapolis, Minn.

[21] Appl. No.: 677,126

[22] Filed: Dec. 3, 1984

[51] Int. Cl.[4] .............................................. H03M 1/00
[52] U.S. Cl. ........................ 340/347 NT; 340/347 AD
[58] Field of Search ................ 340/347 NT, 347 AD; 324/99 D; 328/127

[56] References Cited

U.S. PATENT DOCUMENTS 3,480,769  11/1969  Gilbert ................................. 328/127
3,582,777  6/1971   Wunderman ................. 340/347 NT
3,718,923  2/1973   Horwitz et al. ............. 340/347 NT
3,790,886  2/1974   Kurtin et al. ............... 340/347 NT
3,930,252  12/1975  Storar ......................... 340/347 NT
4,243,975  1/1981   Masuda et al. ............. 340/347 NT Primary Examiner—Bernard Roskoski
Attorney, Agent, or Firm—Charles L. Rubow

[57] ABSTRACT

A control method and apparatus for dual slope analog to digital signal conversion is disclosed in which the time required for input signal integration is sensed. A switch connected across the integrator is closed in response to sensing of an integration time which exceeds the integration interval corresponding to a limit of the expected range of input signal values.

3 Claims, 3 Drawing Figures

DUAL SLOPE ANALOG TO DIGITAL CONVERTER WITH OUT-OF-RANGE RESET

BACKGROUND OF THE INVENTION

The invention disclosed herein relates generally to dual slope analog to digital converters and control methods therefor, and more particularly to a dual slope analog to digital converter method and apparatus providing for reset of the apparatus in the event an over range input signal condition is encountered.

Dual slope analog to digital converters are well known in which an input signal of unknown value is integrated for a predetermined interval of time to produce an output signal which commences at a predetermined value and changes at a rate depending on the difference in values of the unknown input signal and a fixed reference signal. Thereafter, a signal of known value is integrated to produce an output signal having as a starting value the final value of the signal resulting from integration of the unknown input signal, the integration continuing for a period of time sufficient to return the output signal to its predetermined value. Accordingly, the time interval required for integration of the known signal is indicative of the value of the unknown input signal.

The integrator must be returned to its initial condition in order to commence a suceeding analog to digital conversion. Most commonly, the integrator is returned to its initial condition by completion of the previous conversion process, at which time the output signal of an integrator in the converter is at the proper value for commencing integration.

In such operation, a problem may arise where an out-of-range input signal is encountered. In such a situation integration of the unknown input signal results in an output signal of maximum slope in one sense and a corresponding maximum value of the output signal at the end of the known integration interval. Since subsequent integration of the known signal results in an integrator output signal of fixed slope of the opposite sense, substantial time may be taken before the output signal is returned to its predetermined value.

The time required to reestablish initial conditions of the converter after encountering an out-of-range input signal may be several times the length of the interval required to perform an analog to digital conversion of an unknown input signal within the normal range of values. The delay introduced by attempting to process the faulty signal is undesirable, and may unacceptably impede speed of operation of apparatus in which the converter is used.

The applicants have devised a unique and simple method and apparatus for minimizing the unproductive time spent by a dual slope analog to digital converter in attempting to convert an out-of-range signal by immediately returning the converter to its initial state when an out-of-range input signal condition is detected.

SUMMARY OF THE INVENTION

The invention is a method and apparatus for controlling the operation of a dual slope analog to digital converter such that the state of the converter is reinitialized immediately upon detection of an out-of-range input signal condition. The method basically comprises sensing the time involved in the signal integration process in the converter, determining a time limit corresponding to the limiting value of the expected range of input signals, and returning the output signal of the integrator to its initial value after the integration process has continued for the time interval corresponding to the limiting value of the expected input signal range.

Apparatus according to the invention basically comprises an integrator having an input terminal and an output terminal, the input terminal being alternately supplied with a signal of unknown value and a signal of known value, the signal of unknown value being supplied for a predetermined time interval whereby the output signal of integrator commences at a first predetermined value and changes at a rate depending on the difference between the unknown input signal value and a reference signal value to a second undetermined value. Thereafter, the known signal is integrated for an unknown time interval such that the output signal of the integrator has as its starting value the second undetermined value of the output signal and changes at a fixed rate until the predetermined value of the output signal is reached. A switch is connected across the integrator, the switch being controlled by time interval detection means which senses the time being spent in the integration process and closes the switch after a time interval corresponding to the limiting value of the expected range of input signals. The time interval detection circuit may comprise a source of clock pulses and a counter which counts the clock pulses occurring during the integration process and produces a signal to close the switch when the count reaches the number corresponding to the maximum value of the expected range of input signals.

DESCRIPTION OF THE PREFERRED EMBODIMENT

Figure 1A:
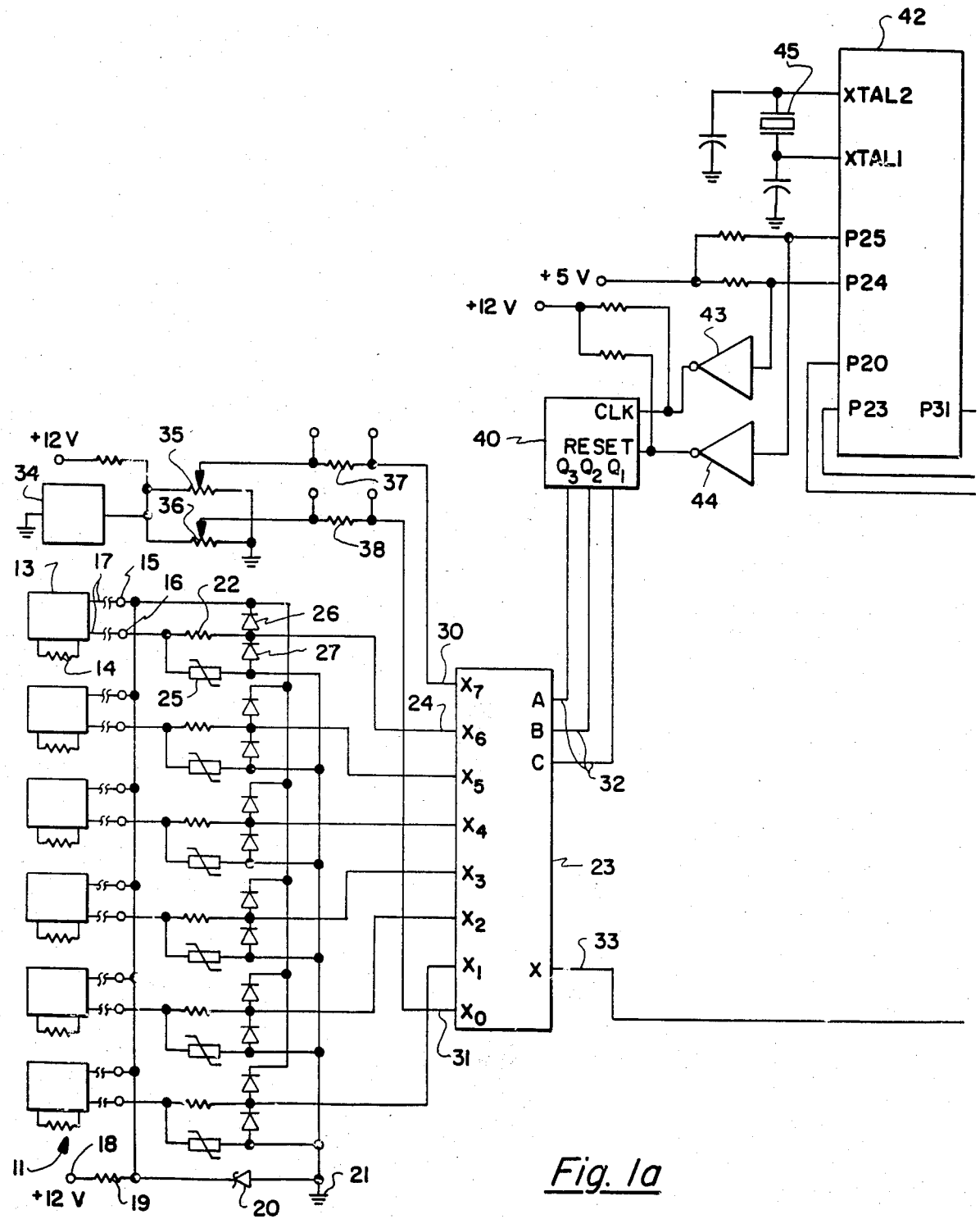
FIGS. 1A, 1B are a schematic circuit diagram of a temperature sensing system employing the dynamically calibrated signal converter of the present invention.
Figure 1B:
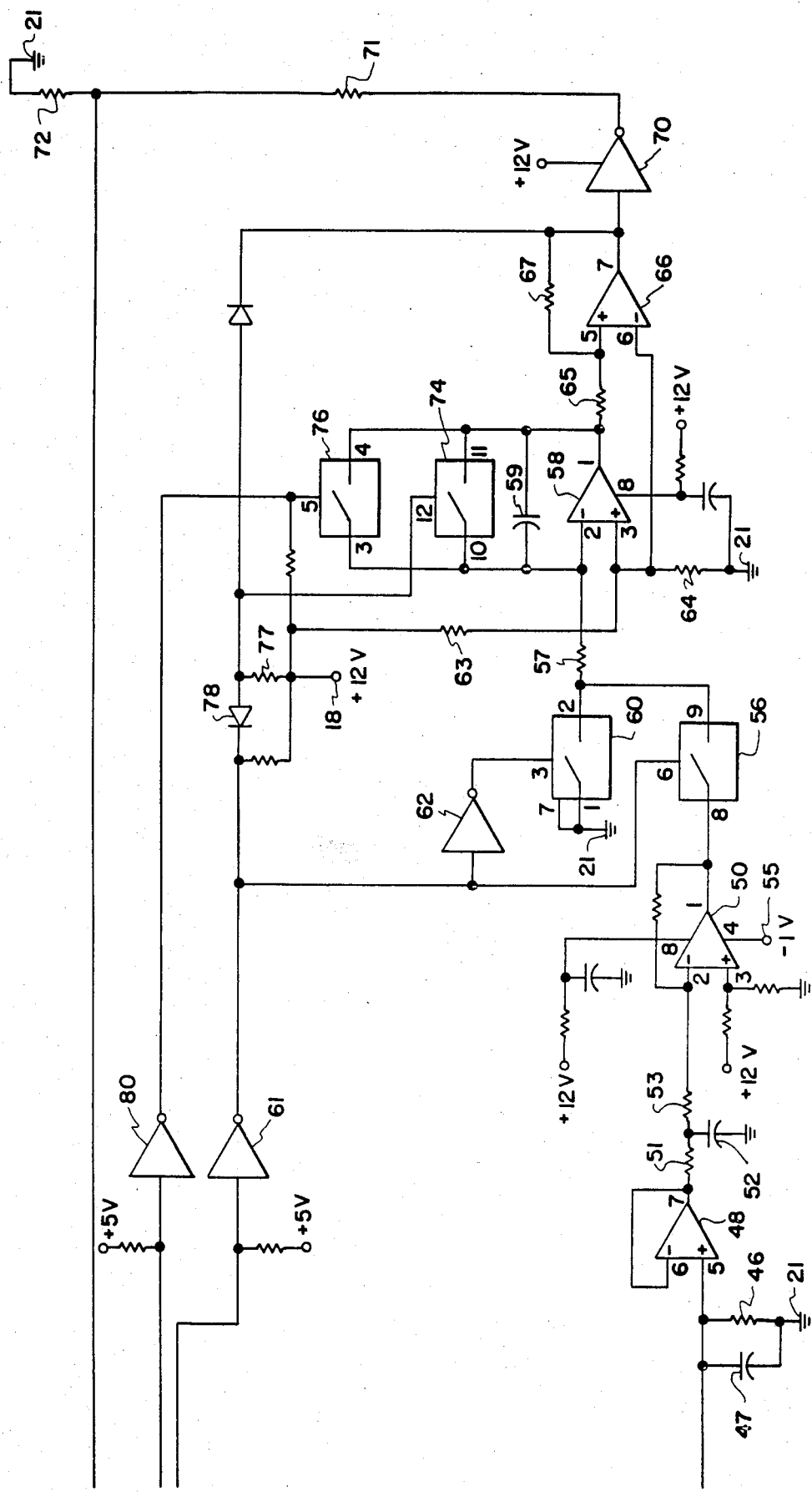

In FIG. 1, reference numeral 11 generally identifies a plurality of sensors for producing signals indicative of parameters of interest, such as temperatures at a plurality of locations. As shown, the sensors are identical, each comprising a current source 13 which produces an electric current proportional to temperature. Such a current source may be a National Semiconductor integrated circuit LM234. A laser trimmed resistor 14 may be provided to achieve the desired constant of proportionality between sensed temperature and current.

Reference numerals 15 and 16 identify input signal receiving terminals to which sensor 13, 14 is connected through a cable 17 of a suitable length to reach the location at which the sensor is installed. Sensors 11 are supplied with a constant voltage from a source 18 which supplies power to various other components in the apparatus. Source 18 is connected to terminal 15 through a resistor 19, and terminal 15 is connected to ground 21 through a zener diode 20 which performs a voltage regulating function.

Terminal 16 and corresponding terminals of the other temperature sensor circuits are each connected through a resistor, such as resistor 22, to a separate input terminal of a multiplexer 23. Specifically, reference numeral 24 identifies the input terminal of multiplexer 23 to which terminal 16 is connected. A varistor 25, which serves to suppress any transient voltage spikes, is connected between terminal 16 and ground 21. A diode 26 is connected between terminal 15 and terminal 24, and a diode 27 is connected between ground 21 and terminal 24.

Multiplexer 23 also includes additional input terminals 30 and 31, address terminals 32 and an output terminal 33. Input terminals 30 and 31 are connected to a calibration signal generator comprising a voltage regulator circuit 34 which supplies a closely regulated temperature compensated reference voltage to a pair of trimming potentiometers 35 and 36. The wiper of potentiometer 35 is connected to input terminal 30 through a precision resistor 37. Similarly, the wiper of potentiometer 36 is connected to input terminal 31 through a precision resistor 38. Taps are provided for measuring the voltages across resistors 37 and 38 to permit setting the wipers of potentiometers 35 and 36 so as to provide calibration currents of appropriate magnitudes to input terminals 30 and 31. The currents are set to correspond to two points on the locus of the sensed temperatures and corresponding output currents of sensors 11.

Multiplexer 23 functions to selectively connect one of multiplexer input terminals to output terminal 33 in response to address signals supplied to address terminals 32. The address signals are generated by a counter 40 having CLK and RESET terminals connected to appropriate pins of a microprocessor identified by reference numeral 42. Inverters 43 and 44 are connected between counter 40 and microprocessor 42, and serve as buffers therebetween to permit different supply voltages to be used with the counter and the microprocessor. Specifically, microprocessor 42 is shown as of a type designed to operate from a +5 volt supply, whereas counter 40 and other circuits in the apparatus are designed to operate from a +12 volt supply.

The operating rate of microprocessor 42 is determined by a crystal 45. Microprocessor 42 provides periodic signals on pins P24 and P25 which are connected to the CLK and RESET terminals of counter 40. Counter 40, in turn, generates address signals for multiplexer 23 so as to sequentially and repetitively connect the multiplexer input terminals to its output terminal.

Output terminal 33 is connected to ground 21 through a resistor 46 having a filter capacitor 47 connected thereacross. Multiplexer 23 serves to sequentially permit current to flow from sensors 11 and the calibration signal generator through resistor 46 where the currents are converted to voltages which are supplied to the noninverting input of an operational amplifier 48 connected in a voltage follower configuration. The output of amplifier 48 is supplied to the inverting input terminal of an operational amplifier 50 through a noise filter comprising a resistor 51 and a capacitor 52. The noise filter is connected to the inverting input terminal of amplifier 50 through a further resistor 53.

Since amplifier 48 is connected in voltage follower configuration, its output voltage generally follows its input voltage. Ideally, with zero current flowing through resistor 46, a zero output voltage should be produced by amplifier 48. However, commonly available operational amplifiers, when connected in a voltage follower configuration, do not act ideally as the input voltage approaches the system reference voltage or ground. Such a situation results in an input signal below the negative saturation voltage of amplifier 48, and the output voltage of amplifier 50 saturating at the positive supply voltage. Therefore, amplifier 48, which is in a common package with amplifier 50, is supplied with a $-1$ volt reference as identified by reference numeral 55. With such an arrangement, at zero volts across resistor 46, the output of amplifier 50 will be near the positive supply voltage and will decrease as the current through the resistor increases.

The output signal of amplifier 50 is supplied through an integrated circuit switch 56 to an integrator comprising a resistor 57 connected to the inverting input terminal of an operational amplifier 58 having a capacitor 59 connected between its output and inverting input terminals. A further integrated circuit switch 60 is connected between ground 21 and resistor 57. Switches 56 and 60 are operated in a complimentary manner by a signal produced at pin P20 of microprocessor 42. Specifically, the signal at pin P20 is supplied through an inverter-buffer 61 directly to the control terminal of switch 56 which is one of several identical switches in an integrated circuit package, pin 6 of the package being the control terminal for switch 56. The output signal of inverter-buffer 61 is also supplied to the control terminal (pin 3) of switch 60 through an inverter 62.

Amplifier 58 is supplied with a reference voltage produced by a voltage divider comprising resistors 63 and 64 connected between supply terminal 18 and ground 21. The junction between resistors 63 and 64 is connected to the noninverting input terminal of amplifier 58. In the disclosed embodiment, the output signal of the integrator is a voltage having a negative slope determined by the difference between the unknown voltage supplied to the inverting input terminal of amplifier 58 and the reference voltage at its noninverting input terminal.

The output signal of the integrator is supplied through a resistor 65 to the noninverting input terminal of an operational amplifier 66 which forms a comparator. A resistor 67 is connected between the output and noninverting input terminals of amplifier 66 to provide predetermined hysteresis in operation of the comparator. The inverting input terminal of amplifier 66 receives the reference voltage from the junction between resistors 63 and 64. The output signal of the comparator is a binary signal whose state is determined by the relative magnitudes of the voltage ramp supplied to the noninverting input terminal of amplifier 66 and the reference voltage supplied to its inverting input terminal.

The output signal of amplifier 66 is supplied through an inverter-buffer 70 to one end of a voltage divider comprising resistors 71 and 72, the other end of the voltage divider being connected to ground 21. Voltage divider 71, 72 serves to reduce the output voltage of inverter 70 to a voltage suitable for use by microprocessor 42. The signal produced at the junction of resistors 71 and 72 is supplied to pin P31 of the microprocessor.

Switches 56 and 60, the integrator comprising resistor 57, amplifier 58 and capacitor 59, comparator 66 and microprocessor 42 function as a dual slope analog to digital converter. Microprocessor 42 initially causes switch 56 to close and switch 60 to open. This connects the input terminal of the integrator to a voltage corresponding to the current through resistor 46, and causes a negative voltage ramp to be produced at the output terminal of the integrator. In the arrangement shown the initial value of the voltage ramp is greater than the reference voltage between resistors 63 and 64, and the output signal of the comparator remains at a logical high as long as the voltage produced by the integrator exceeds the reference voltage. However, as the output voltage of the integrator falls below the reference voltage, the output of amplifier 66 switches to a logical low state. The time between initiation of the integration process and switching of amplifier 66 is variable, and is determined by the magnitude of the current through resistor 46.

Microprocessor 42 switches the signal on pin P20 to a logical low after a fixed time interval which controls the amount of time the unknown voltage is integrated. Switching of pin P20 to a logical low causes switch 56 to open and switch 60 to close which causes the input of the integrator to be connected to a known voltage (ground). The output signal of amplifier 58 then comprises a ramp voltage of fixed positive slope which causes the output of amplifier 66 to switch to a logical high state after a variable time depending on the voltage which the negative slope ramp had reached. The time between reversal of the integrator ramp output signal and switching of the state of a comparator output is representative of the current through resistsor 46, and thus representative of either one of the calibration currents or the temperature sensed by one of temperature sensors 11, depending on the state of multiplexer 23.

As will be described in more detail hereinafter, digitized forms of the calibration signals are used in microprocessor 42 to generate a function representing the locus of sensed temperature values and corresponding sensed signal values at the microprocessor. If the signal supplied to the microprocessor is derived from one of the temperature sensors, the value of that signal is applied to the generated function and a corresponding temperature is determined therefrom.

The integrator is reset by either of two integrated circuit switches 74 and 76. Both switches are connected across capacitor 59. Switch 74 is controlled by the signal on pin P20 of microprocessor 42. The control terminal (pin 12) of switch 74 is biased to hold the switch closed by voltage source 18 and a resistor 77. When a logical high signal is produced on pin P20, initiating the integration process, the signal on pin 12 of switch 74 is pulled low through diode 78, thus opening switch 74 and permitting integration. When the output signal of the comparator is switched to a logical low state at the time the negative slope ramp from the integrator reaches the value of the reference voltage between resistors 63 and 64, the signal at pin 12 of switch 74 is also pulled low through diode 79. This maintains switch 74 in an open condition and permits integration of the known voltage to continue after the signal on pin P20 has switched to a logical low state.

In the event one of sensors 11 is open or a below normal voltage across resistor 46 otherwise occurs, the output voltage of the integrator will have a maximum negative slope, and will accordingly reach a maximum negative value during the fixed integration interval. Since subsequent integration of the known voltage results in a fixed slope voltage ramp, maximum time would be required for the integrator output voltage to recover back to its preintegration value. This unproductive time required to process a faulty signal may be substantial compared to the processing time of a valid signal and is undesirable.

To minimize this problem microprocessor 42 functions to sense when an integration interval exceeds that for input signals within the normal range, and thereupon produces a logical low signal on pin P23. This signal is supplied through inverter-buffer 80 to control pin 5 of switch 76 and serves to close the switch. Closure of switch 76 reinitializes the integrator and permits it to immediately process the next signal in the sequence. In the microprocessor, an over range condition is detected by maintaining a count of clock pulses which occur during each integration interval, and producing a logical low signal on pin P23 if the count exceeds a predetermined number.

The dual slope analog to digital conversion method is mathematically described by the following relationship:

$$\frac{V}{n_{var}} = \frac{V_{ref}}{n_{ref}} \quad (1)$$

where:

V is an unknown input voltage which is to be converted to the value of a sensed parameter (temperature).

$V_{ref}$ is a reference voltage to which the unknown input voltage and a known fixed voltage are compared.

$n_{ref}$ is the number of counts which occur during the fixed time interval that the unknown input voltage is integrated.

$n_{var}$ is the number of counts which occur during integration of the known fixed voltage for the unknown time interval $+ n_{ref}$.

Equation (1) can be transposed as follows:

$$V = \frac{n_{var}}{n_{ref}} \cdot V_{ref} \quad (2)$$

Given two known points $(x_1, y_1)$ and $(x_2, y_2)$ which determine a straight line, an unknown point on the line can be determined if either its x or y value is known from the equation $$\frac{y - y_1}{x - x_1} = \frac{y_2 - y_1}{x_2 - x_1} \quad (3)$$

Thus, $$y - y_1 = \left( \frac{y_2 - y_1}{x_2 - x_1} \right) (x - x_1) \quad (4)$$

As applied in apparatus as shown in FIG. 1 in which temperature sensors 11 are intended to operate over a range of $-20°$ F. to $+127°$ F., the known points are $(V_{low}, -20°$ F.) and $(V_{high}, +127°$ F.). Using equation (2), the known points are:

$$\frac{n_{low}}{n_{ref}} V_{ref}, -20° \text{ F.}$$

$$\frac{n_{high}}{n_{ref}} V_{ref}, +127° \text{ F.}$$

where $n_{low}$ is the number of counts corresponding to the current produced by the first calibration channel, and $n_{high}$ is the number of counts corresponding to the current produced by the second calibration signal. Applying the noted known points to equation (4), $$T_{unknown} - (-20) = (127 - (-20)) \frac{\left(\frac{n_{unknown}}{n_{ref}} - \frac{n_{low}}{n_{ref}}\right) \cdot V_{ref}}{\left(\frac{n_{high}}{n_{ref}} - \frac{n_{low}}{n_{ref}}\right) \cdot V_{ref}} \quad (5)$$

This expression may be simplified as follows:

$$T_{unknown} = 147 \frac{\left(\frac{n_{unknown}}{n_{ref}} - \frac{n_{low}}{n_{ref}}\right)}{\left(\frac{n_{high}}{n_{ref}} - \frac{n_{low}}{n_{ref}}\right)} - 20 \quad (6)$$

The unknown temperature, $T_{unknown}$, can be determined from this equation since $n_{low}$ and $n_{high}$ are produced during reading of the calibration channels and $n_{unknown}$ is produced during a reading of the channel associated with each temperature sensor.

Figure 2:
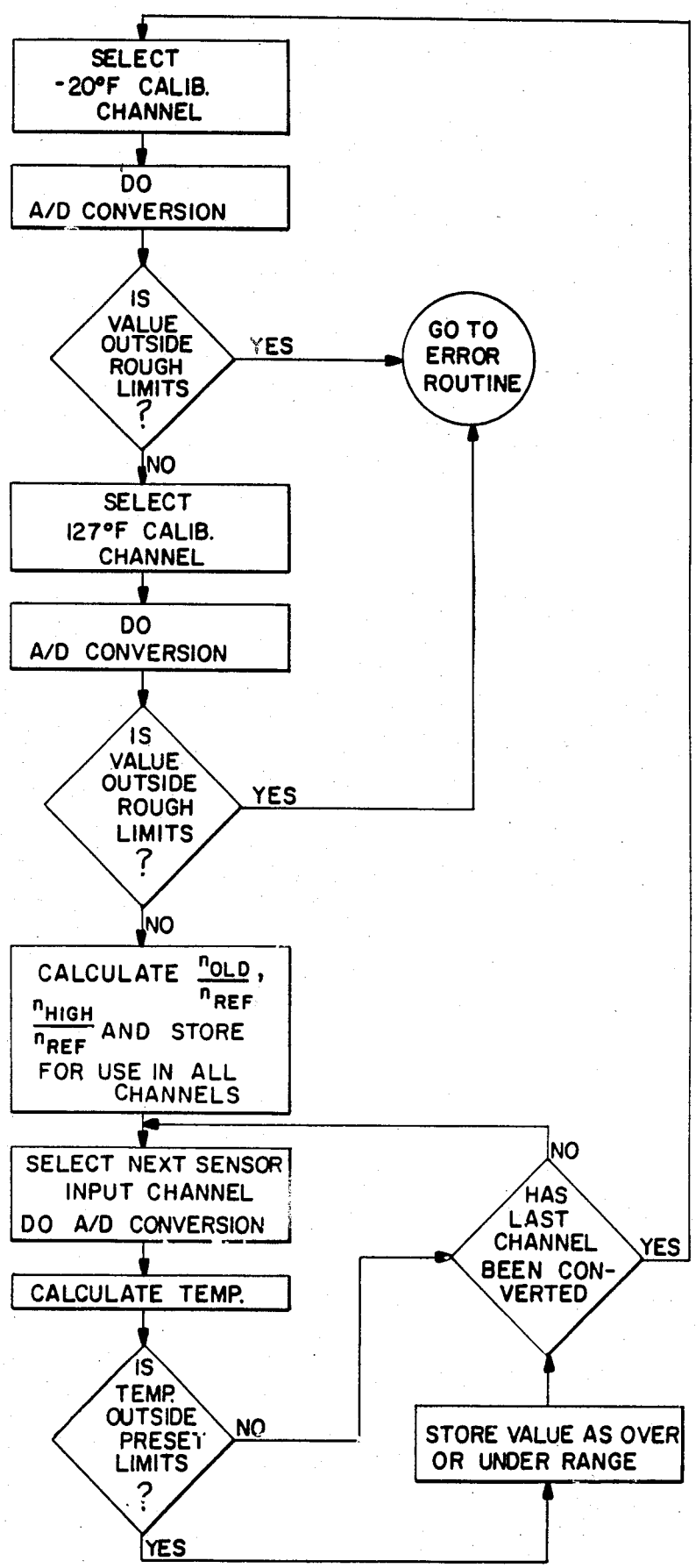
FIG. 2 a flow diagram of a portion of the dynamic calibration process implemented in a microprocessor shown in the circuit of FIG. 1.

The flow diagram of FIG. 2 illustrates how the temperature calculation described above is carried out in microprocessor 42. As indicated, the counts $n_{low}$ and $n_{high}$ are determined with each scan of the temperature sensors and calibration signals to update the function representing the locus of the sensed temperature values and the corresponding signal values to achieve dynamic calibration.

In accordance with the foregoing description, a particular embodiment of the applicants' dynamic self calibration method and apparatus have been set forth for illustrative purposes. Numerous variations and modifications in accordance with the applicants' teachings will be apparent to those of ordinary skill in the relevant arts. It is not intended that coverage be limited to the disclosed embodiment, but only by the terms of the following claims.

The embodiments of the invention in which an exclusive property or right is claimed are defined as follows:

1. Dual slope analog to digital conversion apparatus comprising:
   an integrator circuit including an input terminal for receiving a signal to be integrated, an output terminal, and a capacitor whose charge is changed in one sense when the value of the input signal exceeds a reference signal and whose charge is changed in the opposite sense when the value of the input signal is less than the reference signal;
   signal input means for sequentially supplying a signal of unknown value and a signal of known value to the input terminal of said integrator circuit, the signal of unknown value being supplied for a predetermined interval of time whereby the output signal of said integrator circuit starts at a first predetermined value and changes to a second undetermined value, the signal of known value being supplied for the time interval required for the output signal to return to the first predetermined value, the time interval required for the integration process being proportional to the value of the unknown signal;
   a time interval detector connected to said integrator circuit, said detector being operable to produce a control signal after the integration process has continued for a predetermined interval indicative of a limiting expected value of the signal of unknown value; and
   a switch connected across the capacitor in said integrator circuit and controlled by said time interval detector, said switch being operable to close upon receipt of the control signal to thereby reset said integrator circuit to produce an output signal of the first predetermined value.

2. The conversion apparatus of claim 1 wherein said time interval detector includes:
   a clock pulse source; and
   counter means for counting the clock pulses which occur during the integration process, and supplying the control signal to said switch when a predetermined number of clock pulses is reached.

3. A method of controlling a dual slope analog to digital converter comprising the steps of:
   integrating an analog input signal of unknown magnitude for a known interval of time to produce a ramp output signal which changes from a first predetermined value to a second unknown value at a rate depending on the value of the analog input signal relative to a predetermined reference;
   integrating a signal of known value to produce a ramp output signal having as a starting value the final value of the ramp output signal produced by integrating the input signal of unknown magnitude, said integration continuing until the ramp output signal returns to the first predetermined value;
   sensing the time during which the integration process is continuing;
   determining an integration time interval corresponding to a limit of the expected range of the input signal of unknown magnitude; and
   returning the integrator to its initial condition if the actual integration time exceeds the time interval corresponding to the limit of the expected range.

* * * * *